United States Patent

[11] 3,573,642

[72] Inventor Thomas M. Yackish
Hammond, Ind.
[21] Appl. No. 805,712
[22] Filed Mar. 10, 1969
[45] Patented Apr. 6, 1971
[73] Assignee Motorola, Inc.
Franklin Park, Ill.

[54] BAND-LIMITED FM DETECTOR
6 Claims, 9 Drawing Figs.

[52] U.S. Cl. .......... 329/110, 329/50
[51] Int. Cl. .......... H03d 3/00
[50] Field of Search .......... 325/320, 487; 328/138, 140, 141; 307/233; 329/50, 104, 110, 138

[56] References Cited
UNITED STATES PATENTS
2,462,100 2/1949 Hollabaugh .......... 325/487X
2,462,110 2/1949 Levy .......... 325/487X
2,520,480 8/1950 Tellier .......... 329/138X

*Primary Examiner*—Roy Lake
*Assistant Examiner*—Lawrence J. Dahl
*Attorney*—Mueller & Aichele

ABSTRACT: The output IF signal of an FM receiver is coupled to an AND gate and also used to actuate a timer. The timer output is coupled to a second input of the AND gate and the initial output of the timer enables the AND gate for a fixed predetermined time period. The initial portion of the IF signal disables the AND gate while the terminal portion of each cycle of the IF signal enables the AND gate. The AND gate puts out a signal consisting of a series of pulses which are filtered or integrated to develop an output signal, which is a linear function of the frequency over the band of the FM detector.

INVENTOR
THOMAS M. YACKISH

BY
Mueller, Aichele & Rauner
ATTYS.

Patented April 6, 1971 3,573,642

2 Sheets-Sheet 2

INVENTOR
THOMAS M. YACKISH
BY
Mueller, Aichele & Rauner
ATTYS.

BAND-LIMITED FM DETECTOR

BACKGROUND OF THE INVENTION

With the increasing availability of commercial integrated circuits it has become desirable to use these circuits in communications equipment. However, it is not always possible to directly integrate a discrete circuit, particularly when the discrete circuit incorporates LC tuned circuits such as are normally used in the detector of an FM receiver.

To overcome the limitation or integration caused by LC tuned circuits, pulse counter type detector circuits, which can be integrated, have been developed. In the pulse counter type of detector, pulses are developed having characteristics which are a function of the frequency of the signal and these pulses are filtered in a filter or an integrating network to develop an output signal proportional to the frequency. While this type of circuit can be integrated, the output is often nonlinear and is not band limited such as in the prior-art detectors using LC circuits, for example, a Foster-Seeley discriminator.

SUMMARY OF THE INVENTION

It is, therefore, an object of this invention to provide an improved FM discriminator which can be formed as an integrated circuit.

Another object of this invention is to provide an FM detector having the band limited output characteristics of a Foster-Seeley discriminator.

Another object of this invention is to provide an FM detector of the pulse counter type having an improved signal-to-noise ratio and increased stability.

In practicing this invention a limited IF output signal from the FM receiver is provided. The limited FM signal undergoes a transition from a first voltage level to a second voltage level and then, at a later point in each cycle, undergoes a second transition from the second voltage level back to the first voltage level. At the end of the one cycle the signal again undergoes the transition from the first voltage level to the second voltage level.

The limited IF signal is coupled to an AND gate and a timer. The transition from the first voltage level to the second voltage level is used to start the timer, the output of which is coupled to the AND gate. Initially the timer puts out an enabling signal to the AND gate for a fixed predetermined period of time less than one cycle. When the IF signal is at its first voltage level a second enabling signal is applied to the AND gate and the AND gate develops an output signal during the period of time that both enabling signals are present. The output signal of the AND gate if filtered in a filter or integrating circuit to develop a DC or audio output signal, depending upon the frequency changes of the input signal. The output signal is band limited and has a linear response within the frequency band.

The invention is illustrated in the drawings of which:

DETAILED DESCRIPTION OF THE INVENTION

Figure 1:
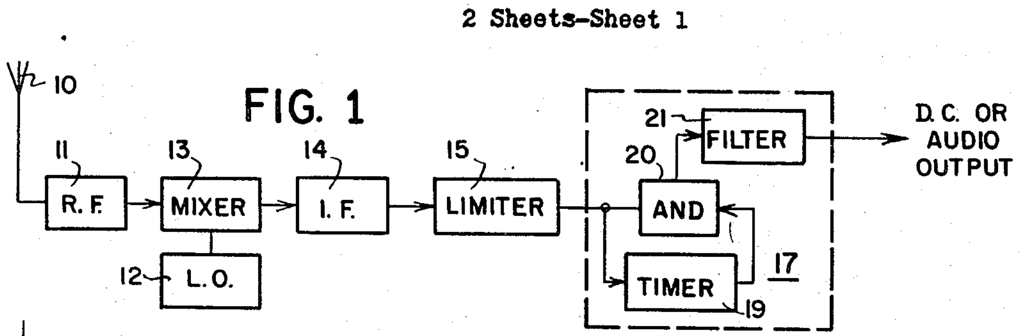
FIG. 1 is a block diagram of the circuit of this invention.

Referring to FIG. 1 there is shown a block diagram of a receiver incorporating the features of this invention. An antenna 10 receives frequency-modulated signals or waves which are amplified in RF section 11 and mixed with a signal from local oscillator 12 in mixer 13. The resulting IF signals or waves are amplified in IF amplifiers 14 and a limited IF signal is developed in limiting amplifiers 15. The limited IF signal is coupled to detector 17.

The limited IF signal from limiter 15 is coupled to AND gate 20 and timer 19. The initial portion of the IF signal actuates timer 19 to develop an enabling signal for a fixed predetermined period of time. This enabling signal is coupled to AND gate 20 to enable the AND gate for this fixed predetermined period of time. The second portion of each cycle of the limited IF signal acts to enable AND gate 20 and an output pulse is developed from AND gate 20 when both enabling signals are present. These pulses are filtered in filter 21 to develop a DC or audio output depending upon the modulation of the IF signal. The filter 21 normally consists of an integration network.

Figure 2:
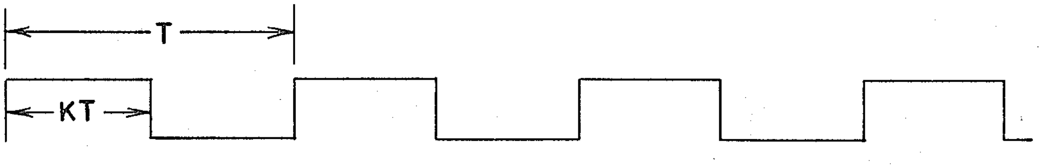
FIGS. 2, 3, 4, 5 and 6 are curves illustrating the operation of the invention.
Figure 2:
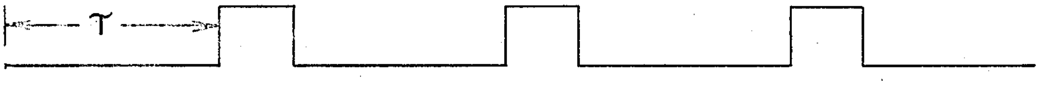
Figure 2:

Referring to FIG. 2($a$) there is shown an IF signal having a particular period $T$ which may be developed by limiter amplifier 15. At the beginning of each cycle of the IF signal there is a transition from a first voltage level to a second voltage level. The limited IF signal remains at the second voltage level for a period of time $KT$, where $K$ is the duty cycle of the IF signal. Normally the duty cycle is 50 percent as shown in FIG. 2($a$) so that each half cycle of the IF signal has the same time duration. In FIG. 2($b$) the output of timer 19 is shown. With the transition of the IF signal from the first voltage level to the second voltage level an enabling signal (in this case a low voltage) is developed by timer 19 for a period of time $\tau$. At the end of time $\tau$timer 19 develops a disabling signal until it is again reset by the transition of the IF signal from the first voltage level to the second voltage level.

The IF signal and the signal from timer 19 are couple to AND gate 20. Since a low-voltage level acts as an enabling signal for AND gate 20, in this example an output is developed by AND gate 20 during the period of time $\tau$—$KT$ and this output is shown in FIG. 2($c$). The output pulses shown in FIG. 2 ($c$) are integrated or filtered to develop a DC level which is a function of the duty cycle of the output pulses.

Figure 3:
Figure 3:
Figure 3:
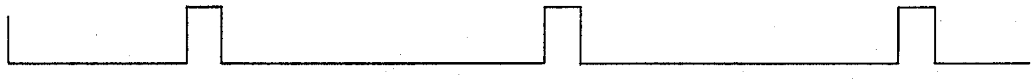

In FIG. 3($a$) an IF signal is shown which has a lower frequency than the signal in FIG. 2($a$). In FIG. 3($b$) the output of timer 19 is again shown and the time 96 is the same as the time $\tau$ of FIG. 2($b$). However, since the period of the IF signal of FIG. 3($a$) is greater than that of FIG. 2($a$) the time during which enabling signals from both timer 19 and the IF signal are present at the inputs to AND gate 20 is less. The output signal from AND gate 20 is shown in FIG. 3($c$) and it can be seen that the duty cycle of the signal of 3($c$) is less than the duty cycle of the signal of 2($c$), and, therefore, a lower output will be developed by filter 21. Thus as the IF signal decreases in frequency, the output of filter 21 is lower.

Figure 4:
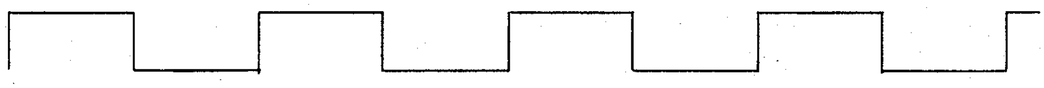
Figure 4:
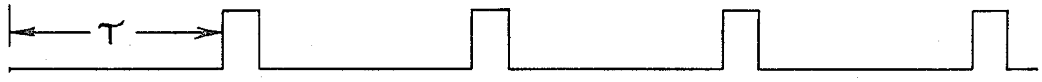
Figure 4:
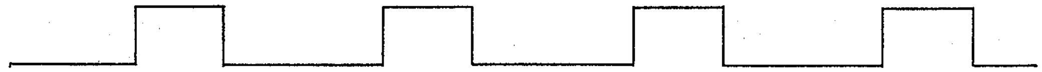

Referring to FIG. 4($a$), there is shown an IF signal having a higher frequency than that of FIG. 2($a$) and, therefore a shorter period. FIG. 4($b$) shows the output signal from timer 19 wherein $\tau$ of FIG. 4($b$) is the same as $\tau$ of FIGS. 2($b$) and 3($b$). FIG. 4($c$) shows the output signal from AND gate 20. It can be seen that the duty cycle of the signal 4($c$) is greater than that of 3($c$) and 2($c$) and, therefore, the output of filter 21 increases in magnitude as the signal from limiter 15 increases in frequency.

Figure 5:
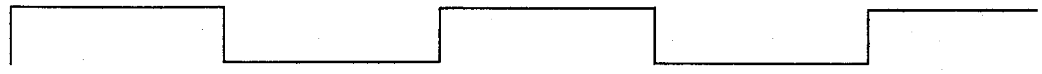
Figure 5:
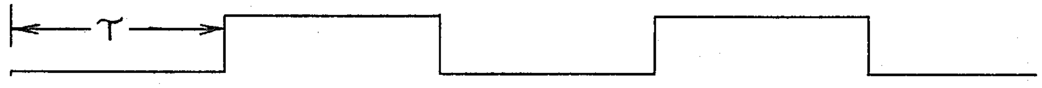

In FIG. 5($a$) there is shown an IF signal wherein the frequency is sufficiently low so that $KT$=$\tau$. It can be seen that in this limiting case, and for any signal lower in frequency, AND gate 20 receives only one enabling signal at a time and therefore never produces an output. Thus below a particular frequency the output of the detector is zero.

Figure 6:
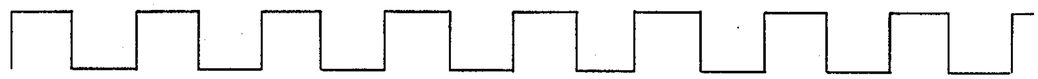
Figure 6:
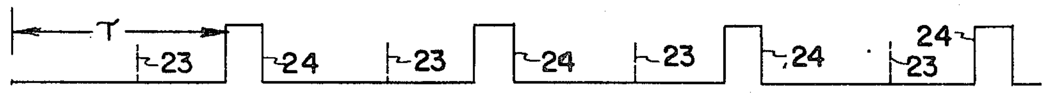
Figure 6:

In FIG. 6($a$) there is shown another limiting case where the frequency is the highest that can be detected by the detector. In the example of 6($a$) the period of the IF signal is less than or equal to $\tau$. As shown in FIG. 6($b$) $\tau$ has the same time duration as $\tau$ shown in FIGS. 2($b$), 3($b$), 4($b$) and 5($b$). There are, however, two different outputs which can be obtained from a signal having a frequency higher than the limiting frequency depending upon the type of timer used. As shown in FIG. 6($b$) a reset pulse for the timer occurs at time 23, during the time the timer is still developing an enabling pulse. Some timing circuits would not react to the reset pulse until the timing cycle had been completed while other timers would reset at this point. If the type of timer is one which would reset at this point it can be seen that the timer would always develop an enabling signal for AND gate 20 and therefore the output of AND gate 20 would follow the IF signal. Since the output signal from AND gate 20 would always have a constant duty cycle regardless of frequency the output of filter 21 would be a constant level.

Referring to FIG. 6(*b*), if timer 19 is of the type which must complete its entire timing cycle before it can be reset, then the output pulses 24 of FIG. 6(*a*) would be developed. With this type of signal couple to AND gate 20, the output shown in FIG. 6(*c*) would be obtained. With the variable duty cycle of 6(*c*) the output would be less than for the limiting frequency, however, it would be a finite value.

It will be apparent from the above that the time period $\tau$ of the timer 19 should be within the range between the period of the lowest frequency of the modulated wave times the duty cycle of the wave, and the period of the highest frequency of the modulated wave. When the wave has a duty cycle of 50 percent, as is usual, the range extends between one-half the period of the lowest frequency of the modulated wave, and the period of the highest frequency of the modulated wave.

Figure 7:
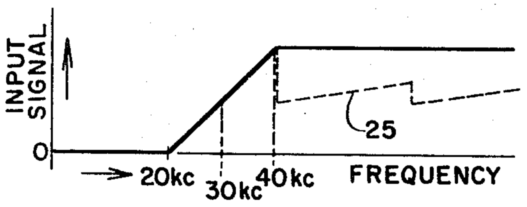
FIG. 7 is a curve showing the DC or audio output obtained from the detector of FIG. 1.

Referring to FIG. 7 there is shown a curve of the output of filter 21 with frequency. As an example the center frequency has been taken as 30 kc. and $\tau$ as 25 microseconds with the IF signal having a 50 percent duty cycle. It can be shown that where $$\tau=\frac{3T}{4}$$

the lower cutoff frequency is two-thirds of the center frequency while the upper cutoff frequency is four-thirds. Referring to the solid curve it can be seen that the output is zero until 20 kc. frequency is reached at which time the output rises linearly until a frequency of 40 kc. is reached. Again referring to the solid line which represents the output of a circuit having a timer which is resettable during its timing period, it can be seen that a constant level output is obtained. Referring to the dashed line 25 this line shows the output which is developed if the timer must complete its timing cycle before it can be reset. This is the integrated output signal of FIG. 6(*c*).

Figure 8:
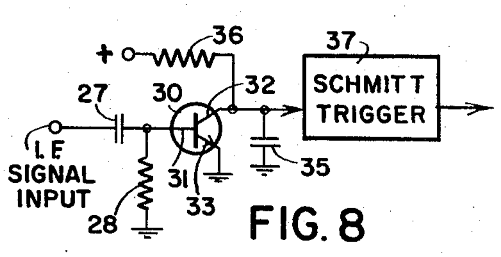
FIG. 8 is a partial schematic and partial block diagram of a timer suitable for use with this invention.

Referring to FIG. 8 there is shown a timing circuit which can be reset during its timing cycle. Input IF signals are coupled to base 31 of transistor 30 through the differentiating network of capacitor 27 and resistor 28. The positive spikes resulting from the differentiation of these IF signals bias transistor 30 to conduction for a very short period of time. With transistor 30 biased to conduction, capacitor 35 is discharged through the collector 32, emitter 33 electrodes of transistor 30. At the end of the positive pulse transistor 30 reverts to its nonconductive state and a ramp signal is generated as capacitor 35 charges through resistor 36. The ramp signal rises until a particular voltage level is reached which will operate Schmitt trigger 37 to develop an output pulse for disabling AND gate 20 of FIG. 1. The rate of rise of the ramp signal is determined by the time constant of resistor 36 and capacitor 35. It can be seen that, since each positive spike applied to base 31 resets the timer, if the frequency of the timing signal is sufficiently high, the ramp voltage developed across capacitor 35 will never reach a point where Schmitt trigger 37 can be actuated.

Figure 9:
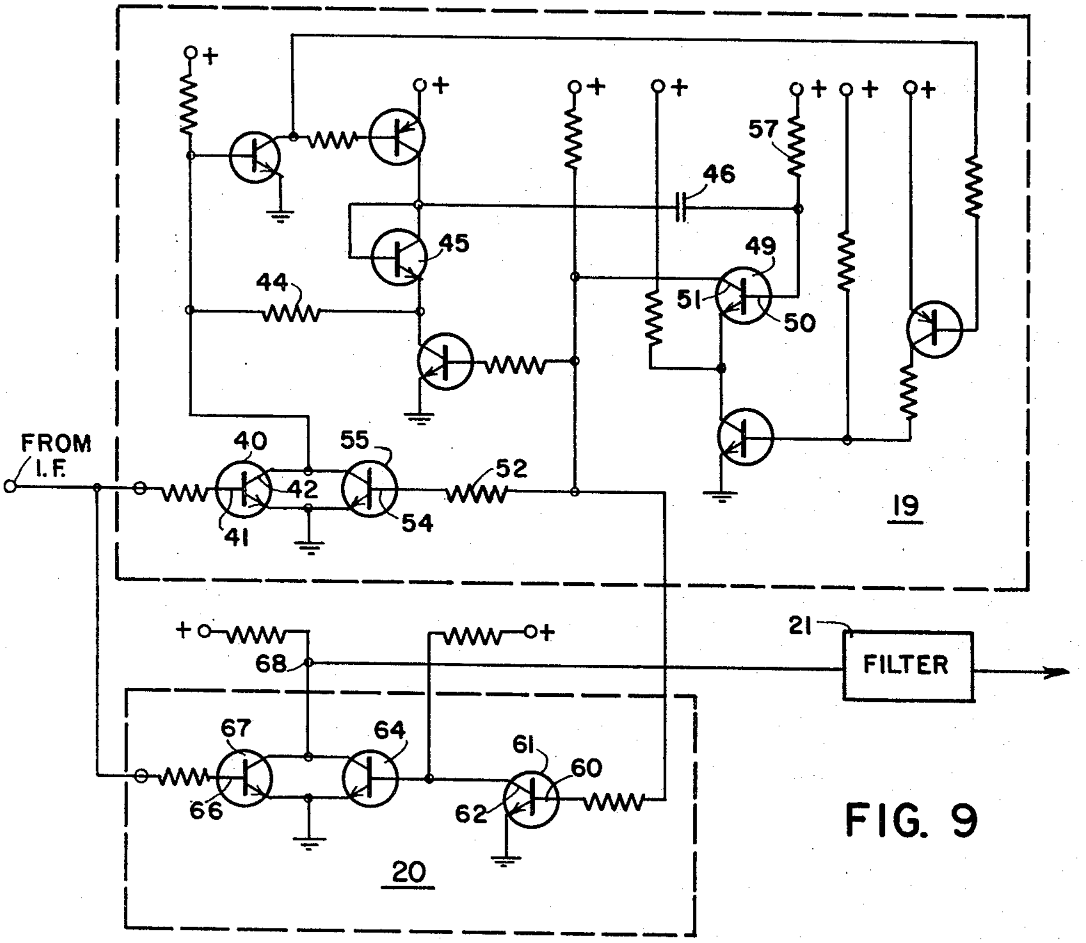
FIG. 9 is a schematic showing one embodiment of the invention.

In FIG. 9 there is shown a partial schematic and partial block diagram of a complete detector circuit showing the AND gate 20, timer 19 and filter 21. The IF signal is applied to base 41 of transistor 40 to bias the transistor to conduction. With transistor 40 biased to conduction the potential on collector 42 drops and this drop in potential is coupled through resistor 44, diode 45 and capacitor 46 to base 50 of transistor 49. Transistor 49 is normally conducting and the negative spike applied to base 50 biases the transistor to nonconduction. With transistor 50 biased to nonconduction the potential on collector 51 rises and this rise in potential is coupled through resistor 52 to base 54 of transistor 55 to bias transistor 55 to conduction. This regenerative action maintains the potential on collector 42 of transistor 40 at a low value even after the IF signal drops to a low value cutting off transistor 40.

Transistor 55 is maintained in a conductive state until capacitor 46 charges through resistor 57 to a predetermined potential. When this predetermined potential is reached, transistor 55 is biased out of saturation and a regenerative switching action biases transistor 55 to nonconduction.

The increased potential on collector 51 of transistor 49 is also coupled to base 60 of transistor 61 biasing transistor 61 to conduction. With transistor 61 biased to conduction the potential on collector 62 drops biasing transistor 64 to nonconduction.

Initially the IF signal applied to base 66 of transistor 67 biases transistor 67 to conduction so that the potential at point 68 is low. When the IF signal drops to its second potential level part way through its cycle, at time *KT*, transistor 67 is biased to nonconduction and the potential of point 68 rises since transistor 64 is also biased to nonconduction. At the end of time $\tau$, with transistor 49 again biased to conduction, the potential on collector 51 drops biasing transistor 61 to nonconduction and transistor 64 to conduction. At the end of time $\tau$ the potential at point 68 again drops since transistor 64 is conducting. Thus in order to get a high output at point 68 both transistors 67 and 64 must be biased to nonconduction. The output pulses formed at point 68 are coupled to filter 21 as previously described.

Thus a band-limited pulse counter detector has been described. The detector has the output characteristics of a Foster-Seeley discriminator but does not require LC circuits so that it can easily be formed as an integrated circuit.

I claim:

1. A band-limited detector for a frequency-modulated wave which alternates between first and second voltage levels, with the frequency of alternation varying from a center frequency in a range between a lowest frequency and a highest frequency, such detector including in combination, timer means adapted to develop an enabling signal for a fixed predetermined time interval after actuation thereof, which time interval is within the range from one-half the period of the lowest frequency of the modulated wave to the period of the highest frequency of the modulated wave, means coupled to said timer means for receiving the frequency-modulated wave and for actuating said timer means in response to each transition of the frequency-modulated wave from the first voltage level to the second voltage level, an AND gate coupled to said timer means and receiving said enabling signal therefrom, means applying the frequency-modulated wave to said AND gate, said AND gate being responsive to said enabling signal and to the frequency-modulated wave to develop an output signal only during the coincidence of said enabling signal and of the first voltage level of the frequency-modulated wave, and means coupled to said AND gate and responsive to said output signal to develop a signal which is a function of the modulation of the frequency-modulated wave.

2. The band-limited detector of claim 1 wherein, said fixed predetermined time interval is made equal to the period of the highest frequency of said frequency-modulated wave.

3. The band-limited detector of claim 1 wherein, the frequency-modulated wave has a fixed duty cycle and said fixed predetermined time interval is made equal to the period of the lowest frequency of said frequency-modulated wave multiplied by said duty cycle.

4. The band-limited detector of claim 1 wherein, the frequency-modulated wave has a fixed 50 percent duty cycle and a fixed center frequency, and said fixed predetermined time interval is made equal to three-fourths of the period of said center frequency of the frequency-modulated wave.

5. The band-limited detector of claim 1 wherein, said means coupled to said AND gate is a filter for developing a signal equal to the average direct current voltage of said output signal.

6. A band-limited detector for a frequency-modulated wave having a fixed center frequency and which varies in frequency between a lowest frequency and a highest frequency, including in combination, limiter means adapted to receive the frequency-modulated wave and responsive thereto to amplify and limit the same whereby the limited frequency-modulated wave undergoes a transition from a first voltage level to a second voltage and from said second voltage level to said first voltage level during one period thereof, timer means coupled to said limiter means and responsive to said limited frequency-modulated wave to develop an enabling signal for a fixed predetermined time interval after said transition from said first voltage level to said second voltage level, which time interval is within the range from one-half the period of the lowest frequency of the modulated wave to the period of the highest frequency of the modulated wave, an AND gate coupled to said timer means and to said limiter means and responsive to said enabling signal and to said limited frequency-modulated wave to develop an output signal only during the coincidence of said enabling signal and of the first voltage level of said limited frequency-modulated wave, and filter means coupled to said AND gate and responsive to said output signal to develop a signal which is a function of the modulation of the frequency-modulated wave.